(12) United States Patent
Lin et al.

(10) Patent No.: US 8,304,988 B2
(45) Date of Patent: Nov. 6, 2012

(54) TANDEM ORGANIC LIGHT EMITTING DEVICE AND METHOD FOR ASSEMBLING THE SAME

(75) Inventors: Yu-Ting Lin, Miaoli County (TW); Hsiang-Lun Hsu, Taichung County (TW)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 246 days.

(21) Appl. No.: 12/327,462

(22) Filed: Dec. 3, 2008

(65) Prior Publication Data

US 2009/0140645 A1    Jun. 4, 2009

(30) Foreign Application Priority Data

Dec. 3, 2007  (TW) .............................. 96145863 A

(51) Int. Cl.
  *H01J 1/62*    (2006.01)
  *H01J 63/04*   (2006.01)
(52) U.S. Cl. ........ 313/506; 313/498; 313/500; 313/504; 313/512
(58) Field of Classification Search ........... 313/498–512
  See application file for complete search history.

(56) References Cited

U.S. PATENT DOCUMENTS

| | | | |
|---|---|---|---|
| 6,107,734 A | 8/2000 | Tanaka et al. | |
| 6,274,980 B1 | 8/2001 | Burrows et al. | |
| 6,337,492 B1 | 1/2002 | Jones et al. | |
| 6,717,358 B1 | 4/2004 | Liao et al. | |
| 7,075,231 B1 | 7/2006 | Liao et al. | |
| 2003/0170491 A1* | 9/2003 | Liao et al. | 428/690 |
| 2005/0173700 A1* | 8/2005 | Liao et al. | 257/40 |
| 2005/0264174 A1* | 12/2005 | Liao et al. | 313/500 |
| 2006/0091794 A1* | 5/2006 | Agostinelli et al. | 313/506 |
| 2006/0244370 A1* | 11/2006 | Tyan et al. | 313/506 |
| 2006/0250079 A1* | 11/2006 | Kwok et al. | 313/506 |
| 2007/0046189 A1* | 3/2007 | Hatwar et al. | 313/506 |
| 2007/0285001 A1* | 12/2007 | Tsai et al. | 313/503 |

* cited by examiner

*Primary Examiner* — Anh Mai
*Assistant Examiner* — Kevin Quarterman
(74) *Attorney, Agent, or Firm* — Morris, Manning & Martin, LLP; Tim Tingkang Xia, Esq.

(57) ABSTRACT

The present invention relates to a tandem organic light emitting device, which reduces the driving voltage by using a non-doping material having both the electron transporting and hole transporting abilities to act, respectively, as an electron transporting layer and a hole transporting layer that are in contact with the connecting layer. The tandem organic light emitting device does not have to double its driving voltage as a result of the increasing of the number of the emitting element contained therein. However, the brightness and the current efficiency of the device of the present invention will be higher than the theoretical fold value calculated in accordance with the number of emitting element contained in the device.

14 Claims, 4 Drawing Sheets

TANDEM ORGANIC LIGHT EMITTING DEVICE AND METHOD FOR ASSEMBLING THE SAME

BACKGROUND OF THE INVENTION

1. Field of the Invention

The present invention relates to a tandem organic light emitting device. More particularly, the present invention relates to a tandem organic light emitting device using particular materials for electron injection layer, hole injection layer and metal layer connecting the electron injection layer and hole injection layer, to increase the number of the organic light emitting element contained therein without increasing the operation voltage by the theoretical fold value.

2. Description of Related Art

Organic light emitting diode (OLED) device or organic electroluminescent (EL) device usually comprises an anode, a cathode and an organic light emitting diode unit between the anode and cathode. The structure of organic light emitting diode unit includes a hole injection layer, a hole transporting layer, an organic light emitting layer, an electron transporting layer, an electron injection layer etc. Having the features of low driving voltage, high luminous intensity, wide viewing angle, and full color display, OLED is considered to have a chance to become the display device of the next generation.

Usually, an OLED is driven by current, and its current efficiency has positive correlation with the current density, but its light-emitting period has negative correlation with the current density. Therefore, how to increase the luminous efficiency without increasing the current density to prevent the decrease of the light-emitting period is an important issue in this field.

To increase the luminous efficiency and light-emitting period of OLED, the technique of series connecting known OLEDs to form tandem OLED has been developed and used. By vertically stacking several independent OLED units, one can increase the luminous efficiency by several folds under the same current density from a single power supply, but the operation voltage also has to be increased by the same folds correspondingly, which limits the application of OLED in display devices. Therefore, developing a tandem organic light emitting device is one of the key points for the commercialization of OLED.

SUMMARY OF THE INVENTION

In view of the disadvantages in the known art, the object of the present invention is to provide a tandem organic light emitting device, which increases the luminous efficiency under the same current density, and reduces the required operation voltage.

To achieve the above object, the tandem organic light emitting device of the present invention comprises (a) an anode; (b) a cathode; (c) at least two organic light emitting diode units between the anode and cathode, wherein the organic light emitting diode comprises the following layers sequentially: a hole injection layer, a hole transporting layer, an organic light emitting layer, an electron transporting layer and an electron injection layer; and (d) at least a connecting layer, wherein each connecting layer is in between the organic light emitting diode units. The material for hole injection layer and electron injection layer contacting with connecting layer in the organic light emitting device of the present invention is a non-doping material having both hole transporting and electron transporting abilities The present invention also relates to a display system, which comprises a tandem organic light emitting device mentioned above, and an input unit to couple with the tandem organic light emitting device, and control the tandem organic light emitting device to display image by the input signal from the input unit.

The present invention uses particular material for the hole injection layer and electron injection layer contacting with connecting layer to increase the number of the emitting element contained therein without increasing the operation voltage by the theoretical fold value.

DETAILED DESCRIPTION OF THE INVENTION

Figure 1:
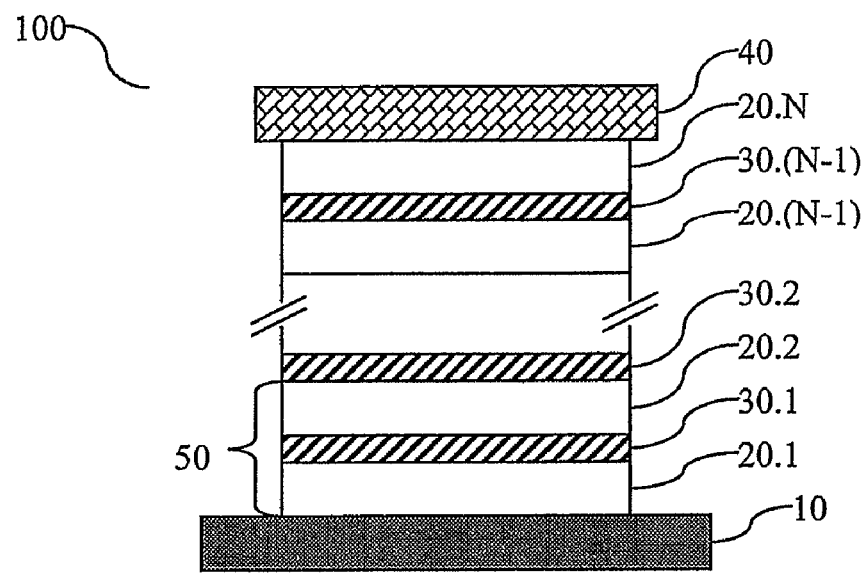
FIG. 1. is a schematic diagram of the tandem organic light emitting device of the present invention.
Figure 2:
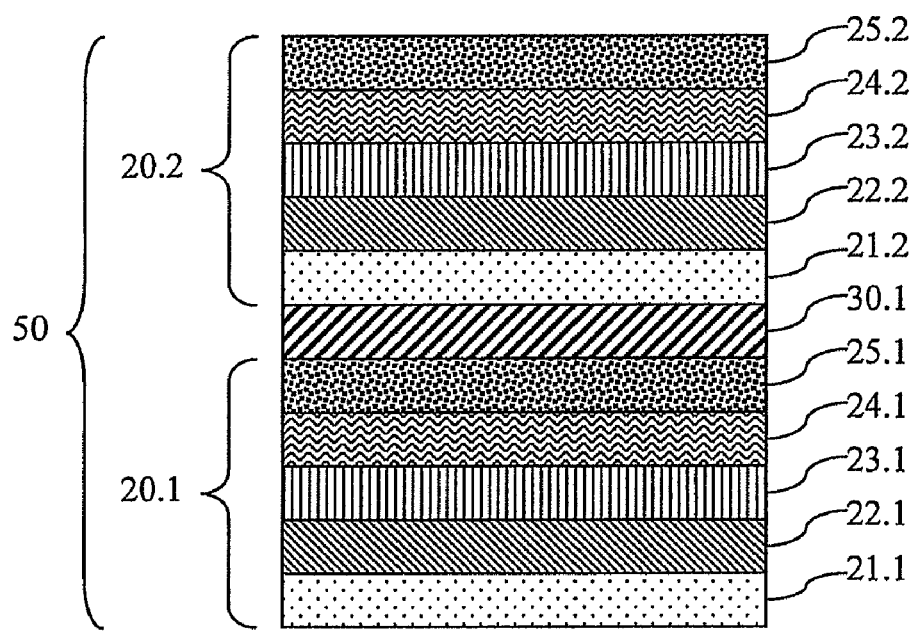
FIG. 2. shows the details structure of the tandem organic light emitting device of the present invention.

The tandem organic light emitting device of the present invention 100 is shown in FIG. 1, which comprises (a) an anode 10; (b) a cathode 40; (c) at least two organic light emitting diode units (i.e., 20.1, 20.2 . . . 20.(N−1), 20.N between anode 10 and cathode 40); and (d) at least one connecting layer (i.e. 30.1, 30.2 . . . 30.(N−1)); wherein an example of two emitting units 50 (including two emitting units 20.1 and 20.2 connected by a connecting layer 30.1) are shown in FIG. 2, which comprises the following layers sequentially: a hole injection layer 21.1, a hole transporting layer 22.1, a organic light emitting layer 23.1, a electron transporting layer 24.1, a electron injection layer 25.1, a connecting layer 30.1, a hole injection layer 21.2, a hole transporting layer 22.2, a organic light emitting layer 23.2, a electron transporting layer 24.2, and a electron injection layer 25.2, wherein each connecting layer 30.1 is in between emitting units 20.1 and 20.2, and the material of hole injection layer 21.2 and electron injection layer 25.1 contacting with connecting layer 30.1 is a non-doping material having both electron and hole transporting abilities.

In tandem organic light emitting devices, when using a non-doping material having both electron and hole transporting abilities as hole injection layer and electron injection layer to contact with appropriate connecting layer material, the energy difference between the lowest unoccupied molecular orbital (LUMO) of hole injection layer and highest occupied molecular orbital (HOMO) of electron injection layer is relatively small, and the energy difference for an electron to jump from electron injection layer to hole injection layer is reduced. When such effect is reflected in a tandem organic light emitting device, the increase of voltage with the number of the emitting unit contained therein according to the theoretical fold value is not necessary.

Therefore, it can be easily understood that the material of hole injection layer and the electron injection layer contacting with connecting layer should have both electron transporting and hole transporting abilities.

The material of hole injection layer contacting with connecting layer can be an organic material, which can be a p-type dopant. Common p-type dopant includes 2,3,5,6-tetrafluoro-7,7,8,8-tetracyanoquinodimethane ($F_4$-TCNQ) and derivatives thereof, fluorocarbon compounds (CFx), lithium fluoride (LiF), silicon dioxide ($SiO_2$), Teflon, 4,4',4''-TRIS-N-naphthyl-N-phenylamino-triphenylamine (TNATA), 4,4',4''-tris(3-methylphenylphenylamino)triphenylamine (m-TDATA) or metal chlorides such as iron chloride etc.

The material of electron injection layer contacting with connecting layer can be an organic material, which can be a n-type dopant. Common n-type dopant includes alkaline metals or compounds thereof, alkaline-earth metals, EEI-101 of OLED-T company or compounds or the mixtures thereof etc. In the tandem organic light emitting device of the present invention, the preferred material for connecting layer 30.1 is aluminum or silver, more preferably aluminum. The thickness of connecting layer is 1 to 200 Å, preferably 10 to 100 Å, more preferably 15 to 50 Å.

Connecting layer is used to connect emitting units, and it contacts with the hole injection layer and electron injection layer of emitting unit. Conventional methods of forming layers in emitting unit is sputtering, but the high temperature causes damage to other layers of the unit. Therefore, in a preferred embodiment of the present invention, evaporation having lower reaction temperature is used to form the connecting layer. By using evaporation, the layers in the organic light emitting device, especially when using non-doping organic material as the election injection layer and hole injection layer, is not easily damaged.

The tandem organic light emitting device of the present invention uses particular material for connecting layer, hole injection layer and electron injection layer contacting with connecting layer to achieve the efficacy of reducing driving voltage. Therefore, the material of other layers in organic light emitting device, including hole transporting layer, electron transporting layer, organic light emitting layer, anode and cathode is not limited. Any materials in the art suitable for forming the above layers and combinations thereof can be applied to the present invention.

For example, the material for anode can be indium tin oxide (ITO); the material for cathode can be aluminum; the material for hole transporting layer can be 4,4'-bis[N-(1-naphthyl-N-phenyl-amino)biphenyl (NPB), N,N'-diphenyl-N,N' bis(3-methylphenyl-1,1'-biphenyl-4,4'-diamine (TPD), N,N'-bis(1-naphthyl)-N,N'-bis(2-naphthyl)benzidine (TNB), 4,4',4''-tris(N,N-diphenyl-amino)triphenylamine (TDATA) and etc.

Usually, an organic light emitting layer contains a host material and a fluorescence dopant emitter. Examples of common host materials are 2-(1,1-dimethylethyl)-9,10-bis(2-naphthalenyl)anthracene (TBADN), 9,10-bis(2-naphthalenyl)anthracene (AND) and derivatives thereof, etc. Fluorescence dopant emitter includes but not limit to anthracene, tetracene, xanthene and the derivatives thereof and etc.

The material for electron transporting layer includes but not limit to 1,3-bis[(p-tert-butyl)phenyl-1,3,4-oxadiazoyl]benzene (OXD-7), aluminum tris(8-hydroxyquinoline) (Alq3), 4,7-diphenyl-1,10-phenanthroline (BPhen), 2,5-bis(6'-(2',2''-bipyridyl)-1,1-dimethyl-3,4-diphenylsilole (Py-PySPyPy), 2,9-dimethyl-4,7-diphenyl-1,10-phenanthroline (BCP), 10-benzo[h]quinolinol-beryllium (BeBq2), 2,2'-[1,1'-biphenyl]4,4'-diylbis[4,6-(p-tolyl)-1,3,5-triazine (TRAZ) and other materials of electron transporting layer in the art.

In the tandem organic light emitting device of the present invention, the driving voltage under a same current density (such as 20 mA/cm$^2$) is smaller than N folds of the driving voltage of a single emitting unit contained therein, where N is the number of organic light emitting unit contained in the device. For example, when the operation voltage of a single organic light emitting unit is V, and a organic light emitting device contains two emitting units, the operation voltage of the device is small than 2V. This feature is not disclosed in the known organic light emitting devices.

The method of reducing the operation voltage of tandem organic light emitting device in the present invention uses non-doping materials having both electron and hole transporting abilities as the hole injection layer and electron injection layer contacting with the connecting layer, where the units including the connecting layer and the material used therein are the same as mentioned above. The method of the present invention increases the number of the emitting element contained in the tandem organic light emitting device without increasing the operation voltage by the theoretical fold value.

Figure 3:
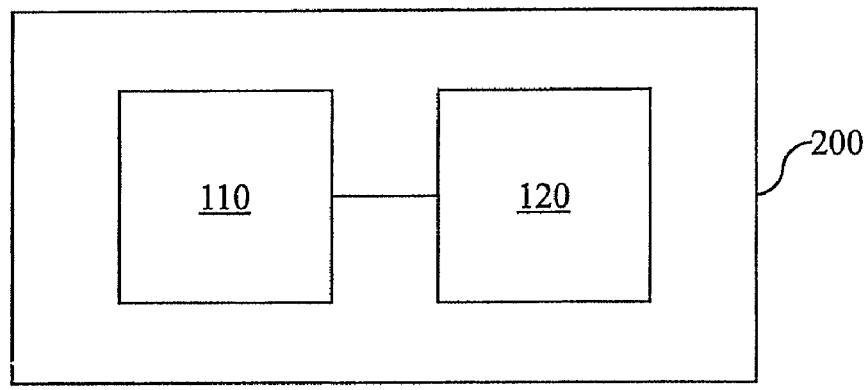
FIG. 3. is a schematic diagram of a display system containing the tandem organic light emitting device of the present invention.

The tandem organic light emitting device of the present invention can be used in different kinds of image display systems. As shown in FIG. 3, which is a schematic diagram of an image display system containing the tandem organic light emitting device of the present invention. Generally speaking, an image display system 200 contains: a display panel 110, which contains the tandem organic light emitting device 100 (as shown in FIG. 1) of the present invention; and an input unit 120, which couples and transmits signals to the display panel 110 to display image. The image display system 200 can be a PDA, a cellular phone, a digital camera, a television, a GPS, a car monitor, an aircraft monitor, a digital photo frame, a laptop, a desktop computer or a portable DVD player.

The tandem organic light emitting device can also be used in different kinds of illumination devices.

The advantages of the present invention are further depicted with the illustration of examples, which however should not be construed as a limitation on the scope of claim.

Example 1

Preparation of Organic Light Emitting Devices Having Both Electron and Hole Transporting Abilities (Element 1)

Organic layers and metal layers were formed on a glass substrate sequentially by evaporation. 90 nm of ITO layer was formed on the glass substrate as anode, and 100 nm of $F_4$-TCNQ layer was formed on the ITO layer as hole injection layer, then 150 nm of aluminum layer was formed on the hole injection layer as cathode.

Example 2

Preparation of Organic Light Emitting Device Having Both Electron and Hole Transporting Abilities (Element 2)

Organic layers and metal layers were formed on a glass substrate sequentially by evaporation. 90 nm of ITO layer was formed on the glass substrate as anode, and 100 nm of α-NPD layer was formed on the ITO layer as hole transporting layer, 50 nm of F$_4$-TCNQ layer was formed on the α-NPD layer as electron injection layer, then 150 nm of aluminum layer was formed on the electron injection layer as cathode.

Control Example 1

Element 3

Organic layers and metal layers were formed on a glass substrate sequentially by evaporation. 90 nm of ITO layer was formed on the glass substrate as anode, and 100 nm of α-NPD layer was formed on the ITO layer as hole transporting layer, then 150 nm of aluminum layer was formed on the hole transporting layer as cathode.

Figure 4:
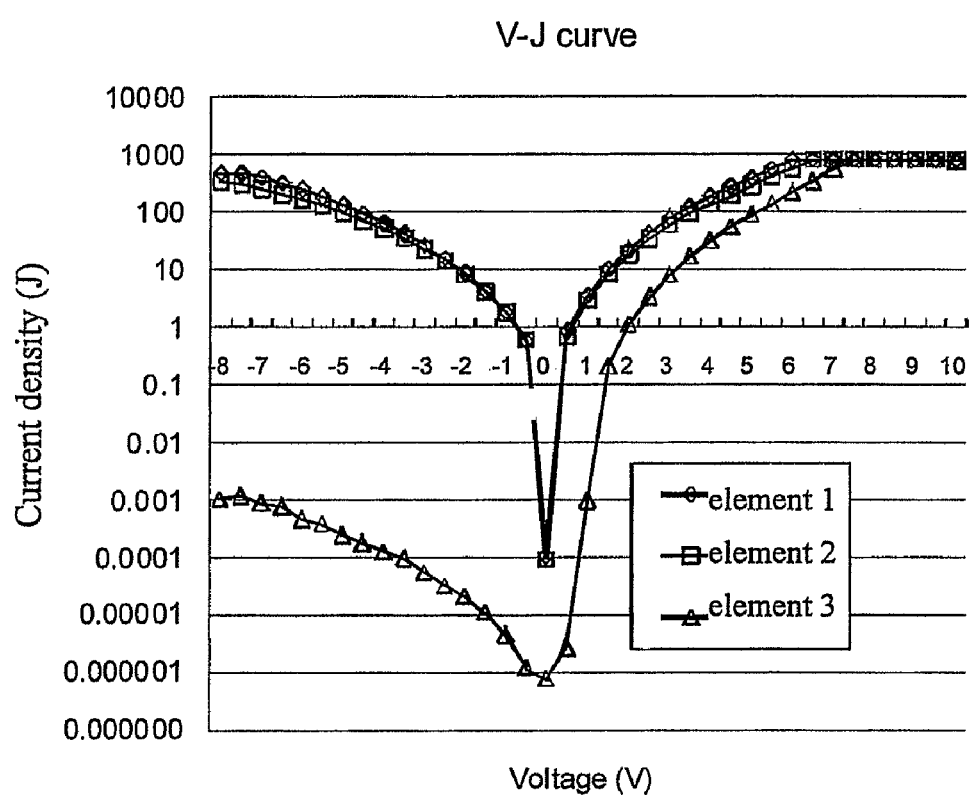
FIG. 4. is the trend plot of voltage and current density of element 1 in example 1, element 2 in example 2, element 3 in control example 1.

The correlation of voltage and current density of element 1, 2 and 3 was measured and plotted in FIG. 4. As shown in the figure, device 1 and device 2 have current flowing under both positive and negative voltage, so non-doping material F$_4$-TCNQ used to form hole injection layer has both electron and hole injection abilities, while device 3 only uses conventional material α-NPD for hole transporting layer, and no current flows under negative voltage.

Example 3

Preparation of Organic Light Emitting Device Having Both Electron and Hole Transporting Abilities (Element 4)

Organic layers and metal layers were formed on a glass substrate sequentially by evaporation. 90 nm of ITO layer was formed on the glass substrate as anode, and 100 nm of EEI-101 made by OLED-T company was formed on the ITO layer as hole injection layer, then 150 nm of aluminum layer was formed on the hole injection layer as cathode.

Example 4

Preparation of Organic Light Emitting Device Having Both Electron and Hole Transporting Abilities (Element 5)

Organic layers and metal layers were formed on a glass substrate sequentially by evaporation. 90 nm of ITO layer was formed on the glass substrate as anode, and 100 nm of Alq3 layer was formed on the ITO layer as electron transporting layer, 1 nm of EEI-101 made by OLED-T company was formed on the Alq3 layer as electron injection layer, then 150 nm of aluminum layer was formed on the electron injection layer as cathode.

Control Example 2

Element 6

Organic layers and metal layers were formed on a glass substrate sequentially by evaporation. 90 nm of ITO layer was formed on the glass substrate as anode, and 100 nm of Alq3 layer was formed on the ITO layer as electron transporting layer, then 150 nm of aluminum layer was formed on the electron transporting layer as cathode.

Figure 5:
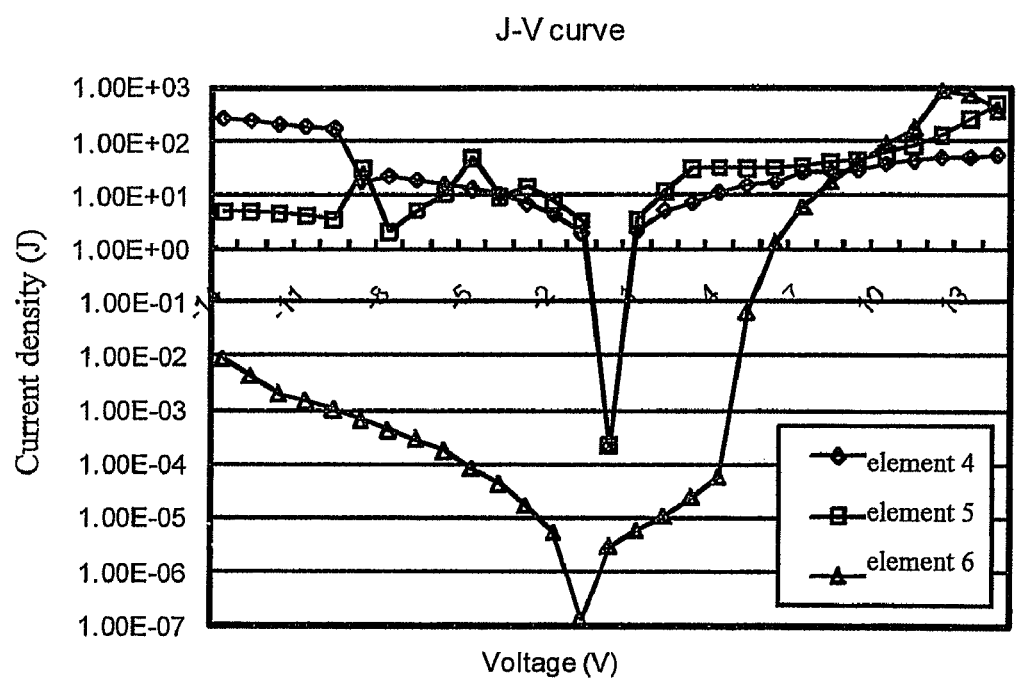
FIG. 5. is the trend plot of voltage and current density of element 4 in example 3, element 5 in example 4, element 6 in control example 2.

The correlation of voltage and current density of element 4, 5 and 6 was measured and plotted in FIG. 5. As shown in the figure, device 4 and device 5 have current flowing under both positive and negative voltage, so non-doping material EEI-101 used to form electron injection layer has both electron and hole injection abilities, while device 6 only uses conventional material Alq3 for electron transporting layer, and no current flows under negative voltage.

Example 5

Preparation of Tandem Organic Light Emitting Device

Organic layers and metal layers were formed on a glass substrate sequentially by evaporation. 90 nm of ITO layer was formed on the glass substrate as anode, and 60 nm of m-TDATA layer was formed on the ITO layer as hole injection layer, 20 nm of α-NPD was formed on the hole injection layer as hole transporting layer, 40 nm of green host material doping green dopant emitter was formed on the electron injection layer as organic light emitting layer, 20 nm of BeBq2 was formed above as electron transporting layer, 1 nm of EEI-101 layer made by OLED-T company was formed as electron injection layer, 2 nm of aluminum was formed as connecting layer, 20 nm of m-TDATA was formed as hole injection layer, 75 nm of α-NPD was formed above as hole transporting layer, 40 nm of green host material doping green dopant emitter was formed as organic light emitting layer, 20 nm of BeBq2 was formed as electron transporting layer, 1 nm of LiF was formed as electron injection layer, then 150 nm of aluminum was formed on electron injection layer as cathode in the end.

Control Example 3

Preparation of Conventional Organic Light Emitting Device

Organic layers and metal layers were formed on a glass substrate sequentially by evaporation. 90 nm of ITO layer was formed on the glass substrate as anode, and 60 nm of m-TDATA layer was formed on the ITO layer as hole injection layer, 20 nm of a-NPD was formed on the hole injection layer as hole transporting layer, 40 nm of green host material doping green dopant emitter was formed as organic light emitting layer, 20 nm of BeBq2 was formed above as electron transporting layer, 1 nm of EEI-101 made by OLED-T company was formed as electron injection layer, then 150 nm of aluminum layer was formed as cathode.

Table 1 is a comparison of working properties tested from the organic light emitting device of the above examples and control examples.

TABLE 1

| Comparison of working properties of organic light emitting device | | | | | |
|---|---|---|---|---|---|
| Device | Driving voltage (V) | Current density (mA/cm$^2$) | Brightness (cd/m$^2$) | Current efficiency (cd/A) | CIE (x, y) |
| Example 5 | 7.84 | 20 | 9083 | 45.41 | (0.294, 0.626) |
| Control example 3 | 5.52 | 20 | 4055 | 20.28 | (0.295, 0.604) |

Figure 6:
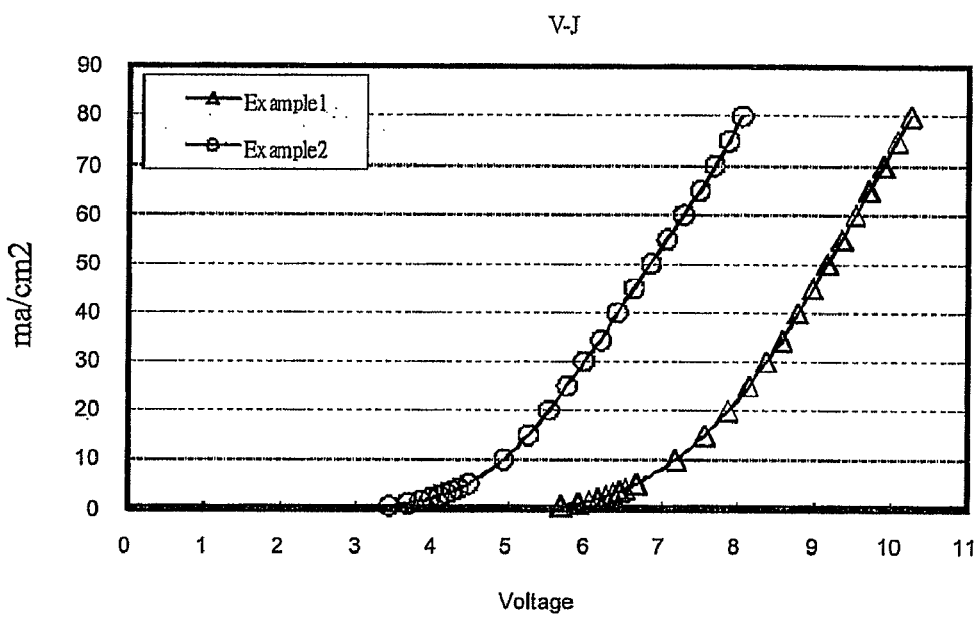
FIG. 6. is the trend plot of current density and driving voltage of organic light emitting device in example 5 and control example 3.

The data in table 1 are driving voltage, brightness, current efficiency and wave length measured from the organic light emitting devices of example 5 and control example 3 under a current density of 20 mA/cm$^2$. When increasing the number of organic light emitting unit, the change in the CIE of light (the light in the present example and control example is green) is extremely small, and the difference of wavelength is only 8 nm (528 nm for the present example, 520 nm for the control example). As shown in FIG. 6, when the current density is 20 mA/cm², the driving voltage of the organic light emitting device in example 5 is 7.84V, which is higher than that of control example 3, but not 2 folds, i.e. the increase of driving voltage with the number of the organic light emitting diode according to the theoretical fold value is not necessary.

Figure 7:
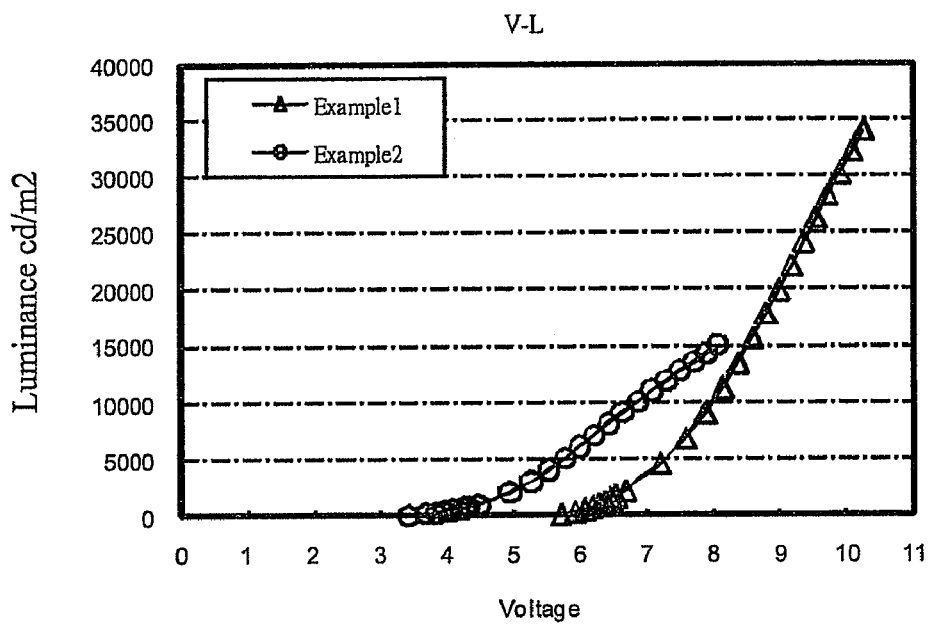
FIG. 7. is the trend plot of brightness and driving voltage of organic light emitting device in example 5 and control example 3.
Figure 8:
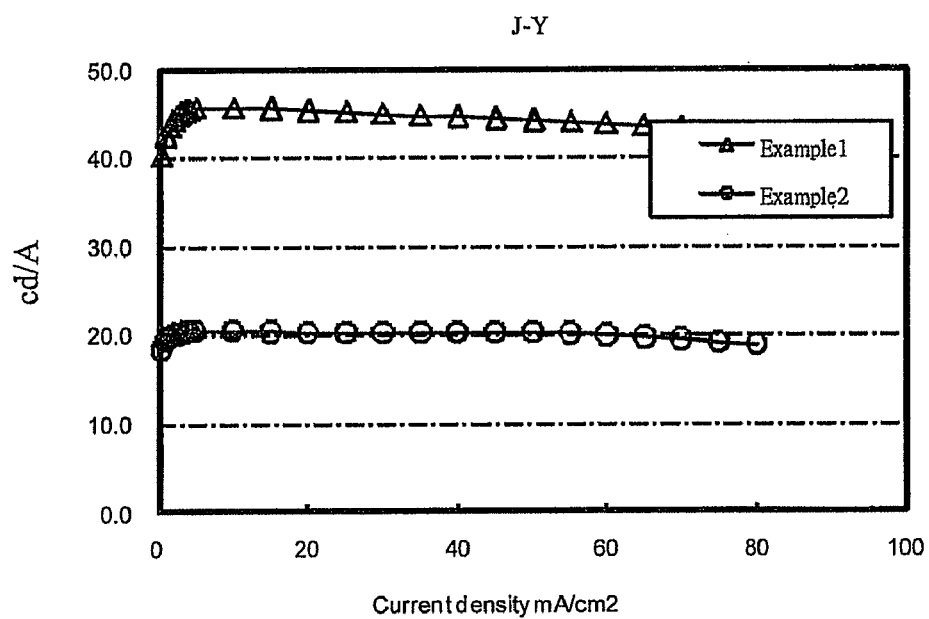
FIG. 8. is the trend plot of current efficiency and current density of organic light emitting device in example 5 and control example 3.

It is known from FIG. 7 that under the same current density, the brightness of the organic light emitting device of the present invention (example 5) is higher than twice of that of the control example without increasing the driving voltage by the same fold accordingly. The results in FIG. 8 further shows that the current efficiency of the organic light emitting device of the present invention is higher than twice of that of the control example 3.

In summary, the present invention uses particular materials for the connecting layer, hole injection layer and electron injection layer contacting with connecting layer to increase the number of the emitting element contained therein without increasing the operation voltage by the theoretical fold value, and the performance of brightness and current efficiency is better than that of the simple addition of single units. The present invention is contributive to the commercialization of organic light emitting devices.

Other Examples

All technical features disclosed in this specification can be combined with other processes, and every single technical feature can be selectively substituted by features the same with, equal to, or similar to the aimed features. Therefore, each technical feature disclosed in this specification is merely an example equal to or similar to the aimed features.

The preferred embodiments of the present invention have been disclosed above, but these embodiments are not used to limit the present invention. Those skilled in the art can make various changes and modifications without departing the spirit and scope of the present invention.

What is claimed is:

1. A tandem organic light emitting device, consisting:
   (a) an anode;
   (b) a cathode;
   (c) at least two organic light emitting diode units placed between said anode and said cathode, wherein said organic light emitting diode unit contains the following layers sequentially: a hole injection layer, a hole transporting layer, an organic light emitting layer, an electron transporting layer and an electron injection layer; and
   (d) at least one connecting layer, wherein each connecting layer is placed between said organic light emitting diode units and contacts with said hole injection layer of one of said organic light emitting diode units and said electron injection layer of the other one of said organic light emitting diode units directly;
      wherein the material of said hole injection layer and said electron injection layer is a non-doping material having both electron and hole transporting abilities; and each of said connecting layer consists of aluminum or silver.

2. The tandem organic light emitting device according to claim 1, wherein the driving voltage of said tandem organic light emitting device is smaller than N folds of that of said organic light emitting diode unit, and N is the number of organic light emitting diode unit contained therein.

3. The tandem organic light emitting device according to claim 1, wherein said non-doping material has current flowing when positive or negative voltage is applied.

4. The tandem organic light emitting device according to claim 1, wherein the material of said hole injection layer is a p-type dopant.

5. The tandem organic light emitting device according to claim 4, wherein p-type dopant comprises 2,3,5,6-tetrafluoro-7,7,8,8-tetracyanoquinodimethane (F4-TCNQ) and derivatives thereof, lithium fluoride (LiF), silicon dioxide (SiO2), Teflon, 4,4',4"-TRIS-N-naphthy-N-phenylamino-triphenylamine (TNATA), 4,4',4"-tris(3-methylphenylphenylamino)triphenylamine (m-TDATA) or metal chlorides.

6. The tandem organic light emitting device according to claim 1, wherein said electron injection layer is a n-type dopant.

7. The tandem organic light emitting device according to claim 6, wherein n-type dopant comprises alkaline metals or compounds thereof, alkaline-earth metals, EEI-101 made by OLED-T company or compounds or mixtures thereof.

8. The tandem organic light emitting device according to claim 1, wherein the thickness of said connecting layer is 1 to 200 Å.

9. The tandem organic light emitting device according to claim 8, wherein the thickness of said connecting layer is 10 to 100 Å.

10. The tandem organic light emitting device according to claim 9, wherein the thickness of said connecting layer is 15 to 50 Å.

11. The tandem organic light emitting device according to claim 1, wherein said connecting layer is formed by evaporation.

12. A image display system, comprising:
   a tandem organic light emitting device according to claim 1; and
   an input unit, coupling with said tandem organic light emitting device, and controlling the tandem organic light emitting device to display image by the input signal from the input unit.

13. The image display system according to claim 12, being a PDA, a cellular phone, a digital camera, a television, a GPS, a car monitor, a aircraft monitor, a digital photo frame, a laptop, a desktop computer or a portable DVD player.

14. A illumination device, comprising:
   a tandem organic light emitting device according to claim 1; and
   an input unit, coupling with said tandem organic light emitting device and controlling the tandem organic light emitting device to illuminate by the input signal from the input unit.

* * * * *